(12) United States Patent
Park

(10) Patent No.: US 9,704,934 B2
(45) Date of Patent: Jul. 11, 2017

(54) THIN FILM TRANSISTOR, ORGANIC LIGHT EMITTING DIODE DISPLAY, AND METHOD FOR MANUFACTURING ORGANIC LIGHT EMITTING DIODE DISPLAY

(71) Applicant: SAMSUNG DISPLAY CO., LTD., Yongin-si, Gyeonggi-Do (KR)

(72) Inventor: Kyung Hoon Park, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/927,000

(22) Filed: Oct. 29, 2015

(65) Prior Publication Data

US 2016/0300896 A1    Oct. 13, 2016

(30) Foreign Application Priority Data

Apr. 8, 2015  (KR) .................. 10-2015-0049807

(51) Int. Cl.
  *H01L 29/08*    (2006.01)
  *H01L 27/32*    (2006.01)
  *H01L 29/786*   (2006.01)
  *H01L 51/05*    (2006.01)
  *H01L 51/50*    (2006.01)

(52) U.S. Cl.
  CPC ...... *H01L 27/3248* (2013.01); *H01L 29/7869* (2013.01); *H01L 51/0545* (2013.01); *H01L 29/78678* (2013.01); *H01L 51/0508* (2013.01); *H01L 51/0512* (2013.01); *H01L 51/50* (2013.01)

(58) Field of Classification Search
  CPC .. H01L 27/3248; H01L 29/7869; H01L 51/56
  See application file for complete search history.

(56) References Cited

U.S. PATENT DOCUMENTS

| 7,211,825 | B2* | 5/2007 | Shih .................. H01L 29/78633 257/13 |
| 2010/0090217 | A1* | 4/2010 | Akimoto ............. H01L 29/7869 257/43 |
| 2011/0186853 | A1* | 8/2011 | Terai ........................ H01L 29/12 257/72 |
| 2012/0235147 | A1* | 9/2012 | Park .................... H01L 27/1255 257/59 |
| 2013/0099232 | A1* | 4/2013 | Cho .................. H01L 29/66969 257/43 |

(Continued)

FOREIGN PATENT DOCUMENTS

| KR | 1020020077378 | 10/2002 |
| KR | 1020060044861 | 5/2006 |

(Continued)

*Primary Examiner* — A. Sefer
(74) *Attorney, Agent, or Firm* — F. Chau & Associates, LLC

(57) ABSTRACT

A thin film transistor includes
a gate electrode including a gate pattern positioned on a substrate and a gate clad pattern covering the gate pattern. An oxide semiconductor layer is positioned on the gate electrode. A source electrode and a drain electrode are positioned on the oxide semiconductor layer. The source electrode and the drain electrode are ach in contact with end portions of the oxide semiconductor layer.

17 Claims, 8 Drawing Sheets

(56) References Cited

U.S. PATENT DOCUMENTS

| | | | | |
|---|---|---|---|---|
| 2013/0134412 A1* | 5/2013 | Godo | ................. | H01L 29/7869 |
| | | | | 257/43 |
| 2015/0155363 A1* | 6/2015 | Nakazawa | .............. | H01L 29/45 |
| | | | | 257/43 |
| 2016/0190175 A1* | 6/2016 | Yamazaki | ........... | H01L 27/1214 |
| | | | | 257/43 |

FOREIGN PATENT DOCUMENTS

| KR | 10-875101 | * 12/2008 |
|---|---|---|
| KR | 100908236 | 7/2009 |
| KR | 1020140140987 | 12/2014 |

* cited by examiner

THIN FILM TRANSISTOR, ORGANIC LIGHT EMITTING DIODE DISPLAY, AND METHOD FOR MANUFACTURING ORGANIC LIGHT EMITTING DIODE DISPLAY

CROSS-REFERENCE TO RELATED APPLICATION

This application claims priority under 35 U.S.C. §119 to Korean Patent Application No. 10-2015-0049807 filed in the Korean Intellectual Property Office on Apr. 8, 2015, the disclosure of which is incorporated by reference herein in its entirety.

(a) TECHNICAL FIELD

Exemplary embodiments of the present invention relate to a thin film transistor, and more particularly to an organic light emitting diode display, and a method for manufacturing an organic light emitting diode display

(b) DISCUSSION OF RELATED ART

A display device, such as an organic light emitting diode display, may display an image.

The organic light emitting diode display may have self-luminance characteristics and might not include a separate light source. Thus, a thickness and a weight of the organic light emitting diode display may be reduced. The organic light emitting diode display may exhibit relatively low consumption of power, relatively high luminance, and relatively fast response speed.

In general, the organic light emitting diode display may include a plurality of thin film transistors and organic light emitting diodes. Each of the thin film transistors may include a gate electrode, a gate insulating layer positioned on the gate electrode, an oxide semiconductor layer positioned on the gate insulating layer, and a source electrode and a drain electrode which are in contact with both ends of the oxide semiconductor layer.

In the thin film transistor of the organic light emitting diode display, since the source electrode and the drain electrode may each be overlapped with the gate electrode, a signal passing through the thin film transistor may be delayed by parasitic capacitance formed in the gate insulating layer positioned between each of the source electrode and the drain electrode and the gate electrode.

SUMMARY

Exemplary embodiments of the present invention provide a thin film transistor, an organic light emitting diode display, and a method for manufacturing an organic light emitting diode display, which may reduce or eliminate a signal delay caused by parasitic capacitance.

An exemplary embodiment of the present invention provides a thin film transistor including a gate electrode including a gate pattern positioned on a substrate and a gate clad pattern covering the gate pattern. An oxide semiconductor layer is positioned on the gate electrode. A source electrode and a drain electrode are positioned on the oxide semiconductor layer. The source electrode and the drain electrode are each in contact with end portions of the oxide semiconductor layer.

The gate pattern may include a metal, and the gate clad pattern may include a metal oxide.

The metal oxide may include indium tin oxide (ITO).

Another exemplary embodiment of the present invention provides an organic light emitting diode display including a substrate and a thin film transistor including a gate electrode. The gate electrode includes a gate pattern positioned on the substrate and a gate clad pattern covering the gate pattern. An oxide semiconductor layer is positioned on the gate electrode. A source electrode and a drain electrode are positioned on the oxide semiconductor layer. The source electrode and the drain electrode are each in contact with end portions of the oxide semiconductor layer. An organic light emitting diode is connected to the thin film transistor.

The organic light emitting diode may include a pixel electrode including a pixel pattern positioned on the same layer as the gate pattern and a pixel clad pattern positioned on the same layer as the gate clad pattern. The pixel clad pattern may cover the pixel pattern, and may be connected to the drain electrode. An organic light emitting layer may be positioned on the pixel electrode. A common electrode may be positioned on the organic light emitting layer.

The substrate may include a pad area spaced apart from an area in which the organic light emitting diode is positioned. The organic light emitting diode display may include a pad portion positioned on the substrate in the pad area. The pad portion may include a pad pattern positioned on the same layer as the gate pattern and a pad clad pattern positioned on the same layer as the gate clad pattern. The pad clad pattern may cover the pad pattern.

One or more of the gate pattern, the pixel pattern, and the pad pattern may include a metal, and one or more of the gate clad pattern, the pixel clad pattern, and the pad clad pattern may include a metal oxide.

The metal oxide may include indium tin oxide (ITO).

The organic light emitting diode display may include a first insulating layer including a first opening positioned between the gate electrode and the oxide semiconductor layer. The first opening may expose the pixel electrode. A portion of the first opening may be larger than the pixel electrode. A second opening may expose the pad portion. A portion of the second opening may be larger than the pad portion.

The thin film transistor may include an etch stopping pattern positioned between each of the source electrode, the drain electrode, and the oxide semiconductor layer. Each of the first opening and the second opening may be formed substantially simultaneously with the etch stopping pattern.

The organic light emitting diode display may include a second insulating layer covering the thin film transistor. The second insulating layer may include a third opening exposing the pixel electrode. A portion of the third opening in communication with the first opening may be larger than the pixel electrode. A fourth opening may expose the pad portion. A portion of the fourth opening in communication with the second opening may be larger than the pad portion.

A portion of the second insulating layer in the pad area may have a lower height than a portion of the second insulating layer in the pixel area.

Another exemplary embodiment of the present invention provides a method for manufacturing an organic light emitting diode display including forming a gate pattern, a pixel pattern, and a pad pattern which are spaced apart from each other, on a substrate. Each of a gate clad pattern, a pixel clad pattern, and a pad clad pattern are formed covering the gate pattern, the pixel pattern, and the pad pattern, respectively. A first insulating layer is formed covering each of the gate clad pattern, the pixel clad pattern, and the pad clad pattern. An oxide semiconductor layer is formed over the gate clad pattern. The first insulating layer is positioned between the oxide semiconductor layer and the gate clad pattern. Each of a first opening exposing the pixel clad pattern in which a portion of the first opening is larger than a portion of the pixel clad pattern and a second opening exposing the pad clad pattern in which a portion of the second opening is larger than a portion of the pad clad pattern in the first insulating layer while forming an etch stopping pattern on the oxide semiconductor layer. A source electrode and a drain electrode that are each in contact with end portions of the oxide semiconductor layer are formed. A second insulating layer covering each of the source electrode and the drain electrode is formed. The second insulating layer includes a third opening exposing the pixel clad pattern. The third opening in communication with the first opening is larger than an upper portion of the pixel clad pattern. A fourth opening exposing the pad clad pattern is formed. The fourth opening in communication with the second opening is larger than an upper portion of the pad clad pattern. An organic light emitting layer is formed on the pixel clad pattern. A common electrode is formed on the organic light emitting layer.

The forming of each of the etch stopping pattern, the first opening, and the second opening may be performed by using a halftone mask.

A portion of the second insulating layer corresponding to the pad clad pattern may have a lower height than the other portion. Forming of the second insulating layer may be performed by using a halftone mask.

The forming of each of the gate clad pattern, the pixel clad pattern, and the pad clad pattern may be performed by using the same mask as that used when forming the gate pattern, the pixel pattern, and the pad pattern.

According to an exemplary embodiment of the present invention, the thin film transistor, the organic light emitting diode display, and the method for manufacturing an organic light emitting diode display reducing or eliminating the signal delay caused by parasitic capacitance may be provided.

BRIEF DESCRIPTION OF THE DRAWINGS

The above and other features of the present invention will become more apparent by describing in detail exemplary embodiments thereof, with reference to the accompanying drawings in which.

DETAILED DESCRIPTION

Figure 1:
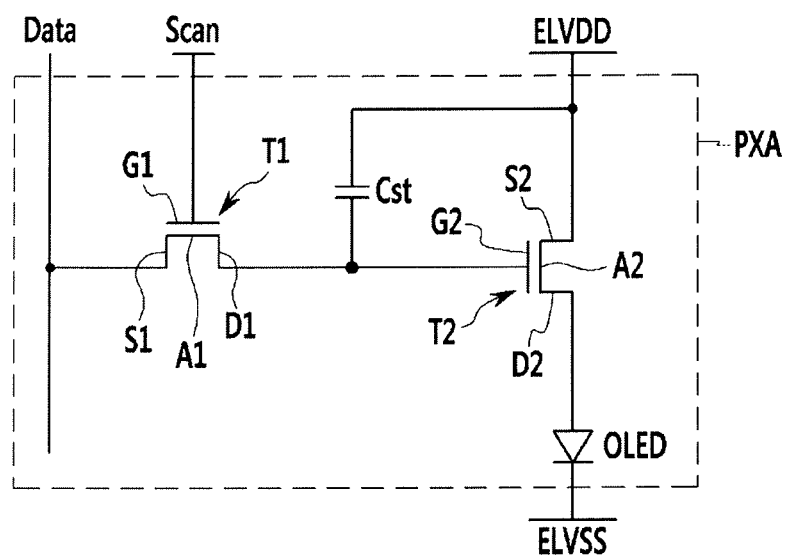
FIG. 1 is a circuit diagram of a pixel area of an organic light emitting diode display according to an exemplary embodiment of the present invention.

Hereinafter, in the following detailed description, the present invention will be described more fully hereinafter with reference to the accompanying drawings, in which exemplary embodiments of the present invention are shown As those skilled in the art would realize, exemplary embodiments of the present invention may be modified in various different ways, all without departing from the spirit or scope of the present invention.

Accordingly, the drawings and description are to be regarded as illustrative in nature and not restrictive. Like reference numerals may designate like elements throughout the specification and drawings.

Sizes and thicknesses of the respective components shown in the drawings may be arbitrarily shown for the convenience of explanation, and exemplary embodiments of the present invention are not necessarily limited to those n the specification and drawings.

In the drawings, the thickness of layers, films, panels and regions, may be exaggerated for clarity. In the drawings, thicknesses of some layers and regions may be exaggerated for convenience of explanation.

Throughout the specification, when an element is referred to as being "on" another element, it may mean that the element is positioned on or below of a target portion, and does not necessarily mean that the element is positioned at an upper side based on a gravity direction.

An organic light emitting diode display of an active matrix (AM) type having a 2Tr-1Cap structure including two thin film transistors (TFT) and one capacitor in one pixel is shown in the accompanying drawings, but exemplary embodiments of the present invention are not limited thereto. The organic light emitting diode display may include three or more thin film transistors and two or more capacitors, and may have various structures by forming separate wirings. A pixel may mean a minimum unit displaying an image, and an organic light emitting diode display may display the image by a plurality of pixels.

Hereinafter, an organic light emitting diode display according to an exemplary embodiment of the present invention will be described in more detail with reference to FIGS. 1 and 2.

Hereinafter, a switching thin film transistor and a driving thin film transistor may each mean a thin film transistor.

FIG. 1 is a circuit diagram of a pixel area of an organic light emitting diode display according to an exemplary embodiment of the present invention.

Referring to FIG. 1, an organic light emitting diode display according to an exemplary embodiment of the present invention may display an image. The organic light emitting diode display may include an organic light emitting diode (OLED) positioned in a pixel area PXA in which pixels are positioned, and may include a scan line Scan, a data line Data, a driving power supply line ELVDD, a common power supply ELVSS, a switching thin film transistor T1, a capacitor Cst, and a driving thin film transistor T2.

Each of the scan line Scan, the data line Data, the driving power supply line ELVDD, and the common power supply ELVSS may be a line through which each of a scan signal, a data signal, a driving signal, and a common signal passes, and each may have various known structures.

The switching thin film transistor T1 may be turned-on and turned-off by the scan signal passing through the scan line Scan, and may connect the data line Data and a gate electrode of the driving thin film transistor T2. The switching thin film transistor T1 may include a first gate electrode G1, a first oxide semiconductor layer A1, a first source electrode S1, and a first drain electrode D1.

The first gate electrode G1 may be connected to the scan line Scan. The first oxide semiconductor layer A1 may include an oxide semiconductor, and the oxide semiconductor may include an oxide including titanium (Ti), hafnium (Hf), zirconium (Zr), aluminum (Al), tantalum (Ta), germanium (Ge), zinc (Zn), gallium (Ga), tin (Sn) or indium (In), and any one or more of zinc oxide (ZnO), indium-gallium-zinc oxide (InGaZnO$_4$), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide(In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide(In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O), or complex oxides thereof.

The first source electrode S1 may be connected to the data line Data. The first source electrode S1 may be connected to one end portion of the first oxide semiconductor layer A1.

The first drain electrode D1 may be spaced apart from the first source electrode S1. The first gate electrode G1 may be positioned between the first drain electrode D1 and the first source electrode S1 and may be connected to the other end portion of the first oxide semiconductor layer A1. The first gate electrode G1 may be connected to the capacitor Cst and a gate electrode of the driving thin film transistor T2.

The switching thin film transistor T1 described above may have a stack structure that is the same as or similar to the driving thin film transistor T2, which is described in more detail below.

The capacitor Cst may be positioned between a second gate electrode G2 of the driving thin film transistor T2 and the driving power supply line ELVDD.

Figure 2:
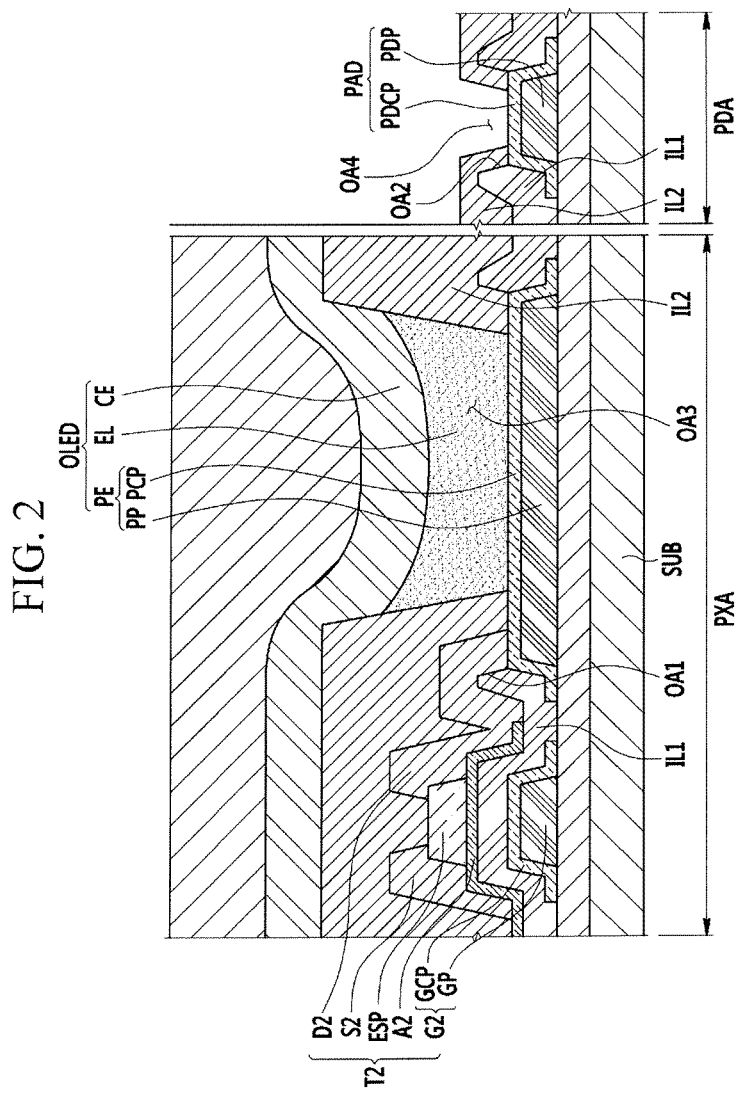
FIG. 2 is a cross-sectional view of the organic light emitting diode display showing a driving thin film transistor and an organic light emitting diode of the pixel area shown in FIG. 1 and a pad area spaced apart from the pixel area.

FIG. 2 is a cross-sectional view of the organic light emitting diode display showing a driving thin film transistor and an organic light emitting diode of the pixel area shown in FIG. 1 and a pad area spaced apart from the pixel area.

Referring to FIG. 2, a pad area PDA may be an area spaced apart from a pixel area PXA, and one or more of a flexible printed circuit board (FPCB), a printed circuit board (PCB), and an integrated circuit (IC) chip may be connected to a pad portion PAD positioned in the pad area PDA. Each of the positions to which the FPCB, PCB, and IC chip are connected, connection methods thereof, and connection structures thereof may each have various known positions, methods, and structures.

Referring to FIGS. 1 and 2, the driving thin film transistor T2 may be turned-on and turned-off by the data signal passing through the switching thin film transistor T1. The driving thin film transistor T2 may connect the driving power supply line ELVDD and the organic light emitting diode (OLED). The driving thin film transistor T2 may include the second gate electrode G2, a second oxide semiconductor layer A2, an etch stopping pattern ESP, a second source electrode S2, and a second drain electrode D2.

The second gate electrode G2 may be positioned over a substrate SUB. A buffer layer may be positioned between the second gate electrode G2 and the substrate SUB. The second gate electrode G2 may be connected to the first drain electrode D1 of the switching thin film transistor T1 and the capacitor Cst.

The second gate electrode G2 may include a gate pattern GP and a gate clad pattern GCP.

The gate pattern GP may be positioned over the substrate SUB. The buffer layer may be positioned between the gate pattern GP and the substrate SUB. The gate pattern may include a metal such as gold (Au), silver (Ag), aluminum (Al), nickel (Ni), iron (Fe), or molybdenum (Mo). The gate pattern GP may include an optical reflective metal.

The gate clad pattern GCP may cover the gate pattern GP and may have a wider width than the gate pattern GP. Thus, the gate clad pattern GCP may surround both a front surface and side surfaces of the gate pattern GP. The gate clad pattern GCP may include a metal oxide such as indium tin oxide (ITO), or indium zinc oxide (IZO).

The first gate electrode G1 may include the gate pattern and the gate clad pattern. The gate pattern and the gate clad pattern of the first gate electrode G1 may be substantially the same as the gate pattern GP and the gate clad pattern GCP of the second gate electrode G2.

The second oxide semiconductor layer A2 may be positioned over the second gate electrode G2. A first insulating layer IL1, which may be a gate insulating layer, may be positioned between the second oxide semiconductor layer A2 and the second gate electrode G2. The second source electrode S2 and the second drain electrode D2 are each in contact with each of both ends of the second oxide semiconductor layer A2.

The first insulating layer IL1 may be included in the organic light emitting diode display, and may be positioned between the second gate electrode G2 and the second oxide semiconductor layer A2. The first insulating layer IL1 may include a first opening OA1 and a second opening OA2. The first opening OA1 may expose at least a portion of a pixel electrode PE of the organic light emitting diode (OLED), which is described below in more detail. The second opening OA2 may expose at least a portion of the pad portion PAD. The first insulating layer IL1 may be a single layer or a multi-layer insulting layer including one or more of an inorganic material and an organic material.

The second oxide semiconductor layer A2 may include an oxide semiconductor. The oxide semiconductor may include an oxide including titanium (Ti), hafnium (Hf), zirconium (Zr), aluminum (Al), tantalum (Ta), germanium (Ge), zinc (Zn), gallium (Ga), tin (Sn) or indium (In), and any one or more of zinc oxide (ZnO), indium-gallium-zinc oxide (InGaZnO$_4$), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide(In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide(In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O), or complex oxides thereof.

A separate passivation layer may be positioned on the second oxide semiconductor layer A2. The separate passivation layer may protect the oxide semiconductor which may be vulnerable to an external environment such as an exposure to high temperature.

The etch stopping pattern ESP may be positioned on the second oxide semiconductor layer A2, and may expose both end portions of the second oxide semiconductor layer A2 which may be in contact with each of the second source electrode S2 and the second drain electrode D2. Each of both end portions of the etch stopping pattern ESP may be positioned between the second source electrode S2 and the second oxide semiconductor layer A, and between the second drain electrode D2 and the second oxide semiconductor layer A2, but exemplary embodiments of the present invention are not limited thereto. For example, each of both end portions of the etch stopping pattern ESP may be spaced apart from each of the second source electrode S2 and the second drain electrode D2. The etch stopping pattern ESP may be formed substantially simultaneously with the first opening OM and the second opening OA2 of the first insulating layer IL1 using a halftone mask. The etch stopping pattern ESP may be a single layer or a multi-layer etch stopping pattern and may include one or more of an inorganic material and an organic material.

The second source electrode S2 may be connected to the driving power supply line ELVDD. The second source electrode S2 may be in contact with one end portion of the second oxide semiconductor layer A2.

The second drain electrode D2 may be spaced apart from the second source electrode S2. The second gate electrode may be disposed between the second drain electrode D2 and the second source electrode S2. The second drain electrode D2 may be connected to the organic light emitting diode (OLED). The second drain electrode D2 may be in contact with the other end portion of the second oxide semiconductor layer A2.

Even though some of each of the second source electrode S2 and the second drain electrode D2 of the driving thin film transistor T2 of the organic light emitting diode display according to an exemplary embodiment of the present invention may overlap the second gate electrode G2, since the second gate electrode G2 may include the gate pattern GP and the gate clad pattern GCP covering the gate pattern GP and consequently, a distance between the gate pattern GP and the second source electrode S2, and a distance between the gate pattern GP and the second drain electrode D2 may each be increased, a delay of a signal passing through each of the second gate electrode G2, the second source electrode S2, and the second drain electrode D2 caused by parasitic capacitance generated in the first insulating layer IL1. which may be the gate insulating layer, corresponding to the overlapped portion may be reduced or eliminated. That is, the driving thin film transistor T2, which may be a thin film transistor having a reduced or eliminated signal delay, may be provided.

A second insulating layer IL2 may be positioned on the driving thin film transistor T2. The second insulating layer IL2 may cover the driving thin film transistor T2. The second insulating layer IL2 may include a third opening OA3 and a fourth opening OA4. The third opening OA3 may expose at least a portion of the pixel electrode PE by being in communication with the first opening OA1 of the first insulating layer IL1. The fourth opening OA4 may expose at least a portion of the pad portion PAD by being in communication with the second opening OA2 of the first insulating layer IL1. The second insulating layer IL2 may be a single layer or a multi-layer insulating layer and may include one or more of an inorganic material and an organic material.

The organic light emitting diode (OLED) may be connected to the second drain electrode D2 of the driving thin film transistor T2, and may include the pixel electrode PE, which may be an anode electrode. The pixel electrode PE, which may be connected to the second drain electrode D2 of the driving thin film transistor T2 by functioning as a hole injection electrode. The OLED may include a common electrode CE, which may be a cathode electrode. The common electrode CE may be connected to the common power supply ELVSS by functioning as an electron injection electrode. An organic light emitting layer EL positioned between the pixel electrode PE and the common electrode CE.

The pixel electrode PE may be positioned on the same layer as the second gate electrode G2 and may be in contact with the second drain electrode D2 of the driving thin film transistor T2, and may include a pixel pattern PP and a pixel clad pattern PCP.

The pixel pattern PP may be positioned on the same layer as the gate pattern GP, and may be positioned over the substrate SUB. The buffer layer may be disposed between the pixel pattern PP and the substrate SUB. The pixel pattern PP may include a metal such as gold (Au), aluminum (Al), nickel (Ni), iron (Fe), or molybdenum (Mo). The pixel pattern PP may include an optical reflective metal.

The pixel clad pattern PCP may cover the pixel pattern PP and may have a wider width than the pixel pattern PP. Thus, the pixel clad pattern PCP may surround both a front surface and side surfaces of the pixel pattern PP. The pixel clad pattern PCP may include a metal oxide such as indium tin oxide (ITO), or indium zinc oxide (IZO).

Since the pixel electrode PE, which may be the hole injection electrode for the organic light emitting layer EL, may include the pixel clad pattern PCP which may be in contact with the organic light emitting layer EL, and may include indium tin oxide having a high work function, hole injection capability of the pixel electrode PE for the organic light emitting layer EL may be increased, thus increasing overall light emitting efficiency of the organic light emitting diode (OLED).

Since the pixel electrode PE may include the pixel pattern PP including the optical reflective metal, light emitted from the organic light emitting layer EL may be reflected by the pixel electrode PE and may be emitted in a direction of the common electrode, thus increasing overall light emitting efficiency of the organic light emitting diode (OLED).

The organic light emitting layer EL may be positioned on the pixel electrode PE and may correspond to the first opening OA1 of the first insulating layer IL1 and the third opening OA3 of the second insulating layer IL2. The organic light emitting layer EL may include one or more of a hole injection layer, a hole transport layer, a main light emitting layer emitting light, an electronic transport layer, and an electronic injection layer.

The common electrode CE may be positioned over the pixel electrode PE. The organic light emitting layer EL may be disposed between the common electrode CE and the pixel electrode PE. The common electrode CE may have a one layer form across the substrate SUB and may correspond to the pixel area PXA. The common electrode CE may be a light transmitting or light transflective electrode, and light emitted from the organic light emitting layer EL may be emitted in the direction of the common electrode CE. An encapsulation may be positioned over the common electrode CE and the encapsulation may have a substrate or thin film form.

The switching thin film transistor T1, the driving thin film transistor T2, and the organic light emitting diode (OLED) may be positioned in the pixel area PXA of the substrate SUB in which the pixels are positioned, and the pad area PAD is positioned spaced apart from the pixel area PXA. The pad area PDA may be an area spaced apart from the pixel area PXA, and one or more of a flexible printed circuit board (FPCB), a printed circuit board (PCB), and an integrated circuit (IC) chip may be connected to the pad portion PAD positioned in the pad area PDA. Each of the positions to which the FPCB, PCB, and IC chip) are connected, connection methods thereof, and connection structure thereof may be known positions, methods, and structures.

The pad portion PAD may be positioned over the substrate SUB. The buffer layer may be disposed between the pad portion PAD and the substrate SUB. The pad portion PAD may correspond to the pad area PDA, and may be positioned on the same layer as the second gate electrode G2. The pad portion PAD may include a pad pattern PDP and a pad clad pattern PDCP.

The pad pattern PDP may be positioned on the same layer as the gate pattern GP, and may be positioned over the substrate SUB. The buffer layer may be disposed between the pad pattern PDP and the substrate SUB. The pad pattern PDP may include a metal such as gold (Au), aluminum (Al), nickel (Ni), iron (Fe), or molybdenum (Mo). The pad pattern PDP may include an optical reflective metal.

The pad clad pattern PDCP may cover the pad pattern PDP and may have a wider width than the pad pattern PDP. Thus, the pad clad pattern PDCP may surround both a front surface and side surfaces of the pad pattern PDP. The pad clad pattern PDCP may include a metal oxide such as indium tin oxide (ITO), or indium zinc oxide (IZO).

A portion of the second insulating layer IL2 corresponding to the pad area PDA in which the pad portion PAD is positioned, may have a lower height than the other portion of the second insulating layer IL2 corresponding to the pixel area PXA. The second insulating layer IL2 may be formed by using an exposure process using a halftone mask.

Since the pad pattern PDP of the pad portion PAD may be surrounded by the pad clad pattern PDCP including indium tin oxide, which is the metal oxide, an occurrence of oxidation with a metal oxide layer, which is a non-conductor, in a surface of the pad portion PAD may be reduced or eliminated. Thus, blocking of an external signal through the pad portion PAD by the metal oxide layer, which is the non-conductor, may be reduced or eliminated.

Since a portion of the second insulating layer IL2 corresponding to the pad area PDA in which the pad portion PAD may be positioned, may have a lower height than the other portion of the second insulating layer IL2 corresponding to the pixel area PXA, one or more configurations of a flexible printed circuit board (FPCB), a printed circuit board (PCB), and an integrated circuit (IC) chip which are connected to the pad portion PAD may be connected to the pad portion PAD.

As such, even though some of each of the second source electrode S2 and the second drain electrode D2 of the driving thin film transistor T2 of the organic light emitting diode display according to an exemplary embodiment of the present invention may be overlapped with the second gate electrode G2, since the second gate electrode G2 may include the gate pattern GP and the gate clad pattern GCP covering the gate pattern GP, and a distance between the gate pattern GP and the second source electrode S2, and a distance between the gate pattern GP and the second drain electrode D2 may each be increased, a delay of a signal passing through each of the second gate electrode G2, the second source electrode S2, and the second drain electrode D2 caused by parasitic capacitance generated in the first insulating layer IL1. which may be the gate insulating layer, corresponding to the overlapped portion may be reduced or eliminated. That is, the organic light emitting diode display including the driving thin film transistor T2, which may be a thin film transistor in which the signal delay caused by the parasitic capacitance is reduced or eliminated, may be provided.

In the organic light emitting diode display according to an exemplary embodiment of the present invention, since the pixel electrode PE, which may be the hole injection electrode for the organic light emitting layer EL may include the pixel clad pattern PCP which may be in contact with the organic light emitting layer EL and may include indium tin oxide having a relatively high work function, hole injection capability of the pixel electrode PE for the organic light emitting layer EL may be increased, thus increasing overall light emitting efficiency of the organic light emitting diode (OLED).

In the organic light emitting diode display according to an exemplary embodiment of the present invention, since the pixel electrode PE may include the pixel pattern PP including the optical reflective metal, light emitted from the organic light emitting layer EL may be reflected by the pixel electrode PE and may be emitted in a direction of the common electrode CE, thus increasing overall light emitting efficiency of the organic light emitting diode (OLED).

In the organic light emitting diode display according to an exemplary embodiment of the present invention, since the pad pattern PDP of the pad portion PAD may be surrounded by the pad clad pattern PDCP including indium tin oxide, which may be the metal oxide, an occurrence of oxidation with the metal oxide layer, which is a non-conductor, in the surface of the pad portion PAD may be reduced or eliminated. Thus, the organic light emitting diode display in which blocking of transmission of an external signal through the pad portion PAD by the metal oxide layer, which may be the non-conductor, is reduced or eliminated may be provided.

In the organic light emitting diode display according to an exemplary embodiment of the present invention, since a portion of the second insulating layer IL2 corresponding to the pad area PDA in which the pad portion PAD may be positioned, may have a lower height than the other portion of the second insulating layer IL2 corresponding to the pixel area PXA, one or more configurations of a flexible printed circuit board (FPCB), a printed circuit board (PCB), and an integrated circuit (IC) chip may be connected to the pad portion PAD.

In the organic light emitting diode display according to an exemplary embodiment of the present invention, since each of the second gate electrode G2, the pixel electrode PE, and the pad portion PAD may include the gate clad pattern GCP, the pixel clad pattern PCP, and the pad clad pattern PDCP, respectively, delay of the signal passing through the second gate electrode G2 by the parasitic capacitance may be reduced or eliminated. The light emitted from the organic light emitting layer EL may be reflected by the pixel electrode PE, thus increasing light emitting efficiency of the organic light emitting diode (OLED). Oxidation of the surface of the pad portion PAD with the non-conductive metal oxide layer may be reduced or eliminated.

Hereinafter, a method for manufacturing an organic light emitting diode display according to an exemplary embodiment of the present invention will be described with reference to FIGS. 3 to 8. The organic light emitting diode display according to an exemplary embodiment of the present invention described above may be manufactured by using the method for manufacturing an organic light emitting diode display according to another exemplary embodiment of the present invention.

Figure 3:
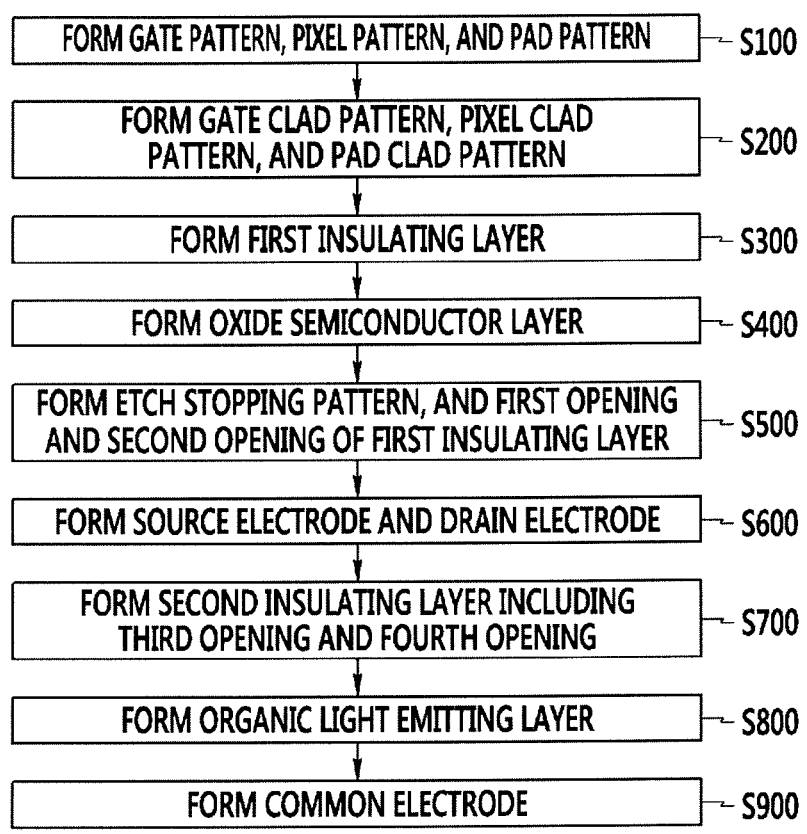
FIG. 3 is a flowchart showing a method for manufacturing an organic light emitting diode display according to an exemplary embodiment of the present invention.

FIG. 3 is a flowchart showing a method for manufacturing an organic light emitting diode display according to an exemplary embodiment of the present invention. FIGS. 4 to 8 are cross-sectional views illustrating the method for manufacturing an organic light emitting diode display according to an exemplary embodiment of the present invention.

Figure 4:
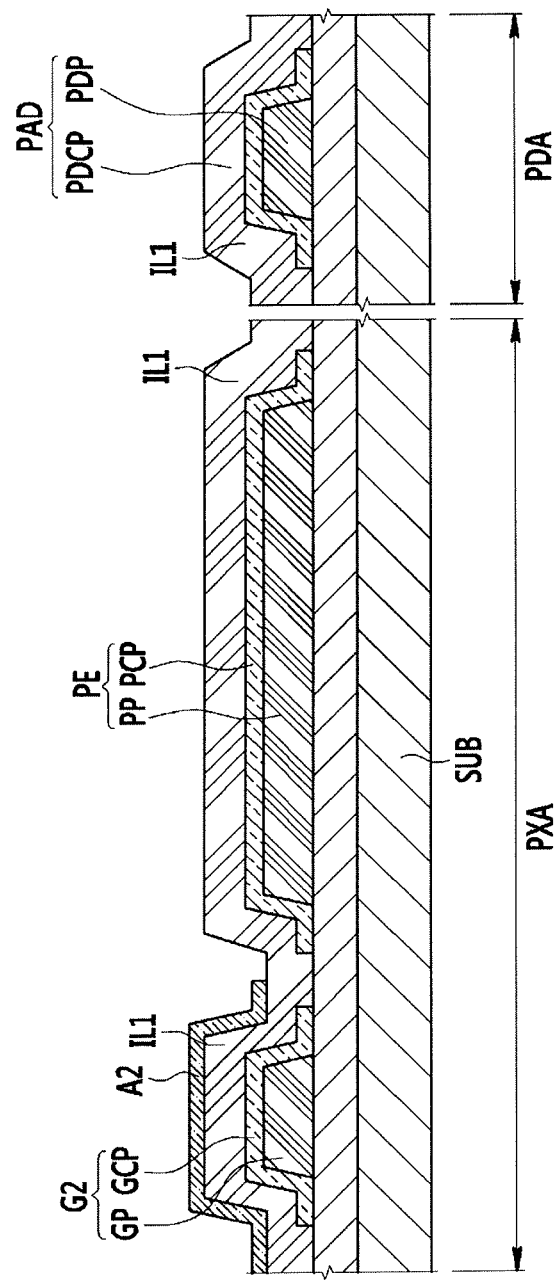
FIGS. 4, 5, 6, 7 and 8 are cross-sectional views illustrating a method for manufacturing an organic light emitting diode display according to an exemplary embodiment of the present invention.

As shown in FIGS. 3 and 4, the gate pattern GP, the pixel pattern PP, and the pad pattern PDP may be formed (S100).

Each of the gate pattern GP, the pixel pattern PP, and the pad pattern PDP which may be spaced apart from each other on the substrate SUB may be formed by forming the buffer layer on the substrate SUB, forming a metal layer on the substrate SUB, and then patterning the metal layer using a photolithography process using the mask. The gate pattern GP and the pixel pattern PP may be formed in the pixel area PXA of the substrate SUB, and the pad pattern PDP may be formed in the pad area PDA of the substrate SUB.

Next, the gate clad pattern GCP, the pixel clad pattern PCP, and the pad clad pattern PDCP may be formed (S200).

After the metal oxide layer such as indium tin oxide (ITO) covering the gate pattern GP, the pixel pattern PP, and the pad pattern PDP is formed, the gate clad pattern GCP, the pixel clad pattern PCP, and the pad clad pattern PDCP covering the gate pattern GP, the pixel pattern PP, and the pad pattern PDP, respectively, may be formed by patterning the metal oxide layer using the photolithography process using the mask. The mask used in the photolithography process forming the gate clad pattern GCP, the pixel clad pattern PCP, and the pad clad pattern PDCP may use the same mask as that used when forming the gate pattern GP, the pixel pattern PP, and the pad pattern PDP, and the gate clad pattern GCP, the pixel clad pattern PCP, and the pad clad pattern PDCP covering the gate pattern GP, the pixel pattern PP, and the pad pattern PDP, respectively, may be formed by adjusting an exposure amount to a photoresist layer.

Thus, the second gate electrode G2, the pixel electrode PE, and the pad portion PAD may be formed. The first gate electrode may be formed together with the second gate electrode G2.

Next, the first insulating layer IL1 may be formed (S300)

The first insulating layer IL1 covering each of the gate clad pattern GCP, the pixel clad pattern PCP, and the pad clad pattern PDCP may be formed. The first insulating layer IL1 may be formed in a single layer or a multi-layer including one or more of an inorganic material and an organic material.

Next, the oxide semiconductor layer may be formed (S400).

The second oxide semiconductor layer A2 may be formed by forming the oxide semiconductor layer on the first insulating layer IL1 and patterning the oxide semiconductor layer using the photolithography process. The first oxide semiconductor layer may be formed together with the second oxide semiconductor layer.

Figure 5:
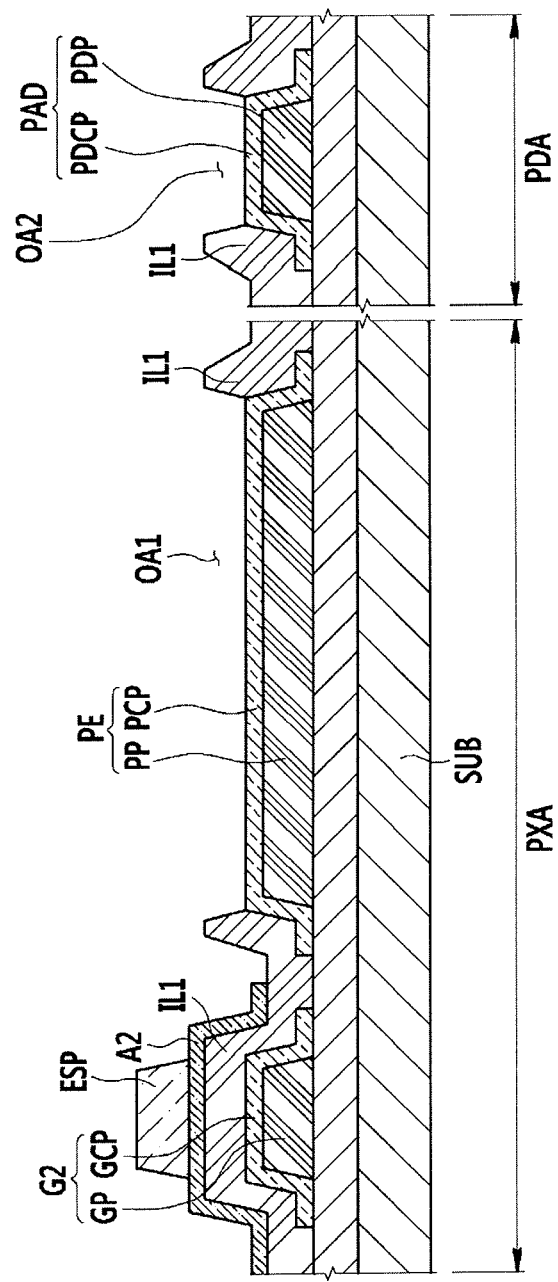

Next, as shown in FIG. 5, the etch stopping pattern ESP, and the first opening OA1 and the second opening OA2 of the first insulating layer IL1 may be formed (S500).

After the etch stopping layer including one or more of the inorganic material and the organic material is formed on the second oxide semiconductor layer A2, the first opening OA1 exposing at least a portion of the pixel clad pattern PCP and the second opening OA2 exposing at least a portion of the pad clad pattern PDCP may each be formed in the first insulating layer IL1 while forming the etch stopping pattern ESP on the second oxide semiconductor layer A2 by patterning the etch stopping layer using the photolithography process using the halftone mask and patterning the first insulating layer IL1 at substantially the same time. The first opening may be expose at least an upper portion of the pixel clad pattern PCP. The second opening may be expose at least an upper portion of the pad clad pattern PDCP.

Figure 6:
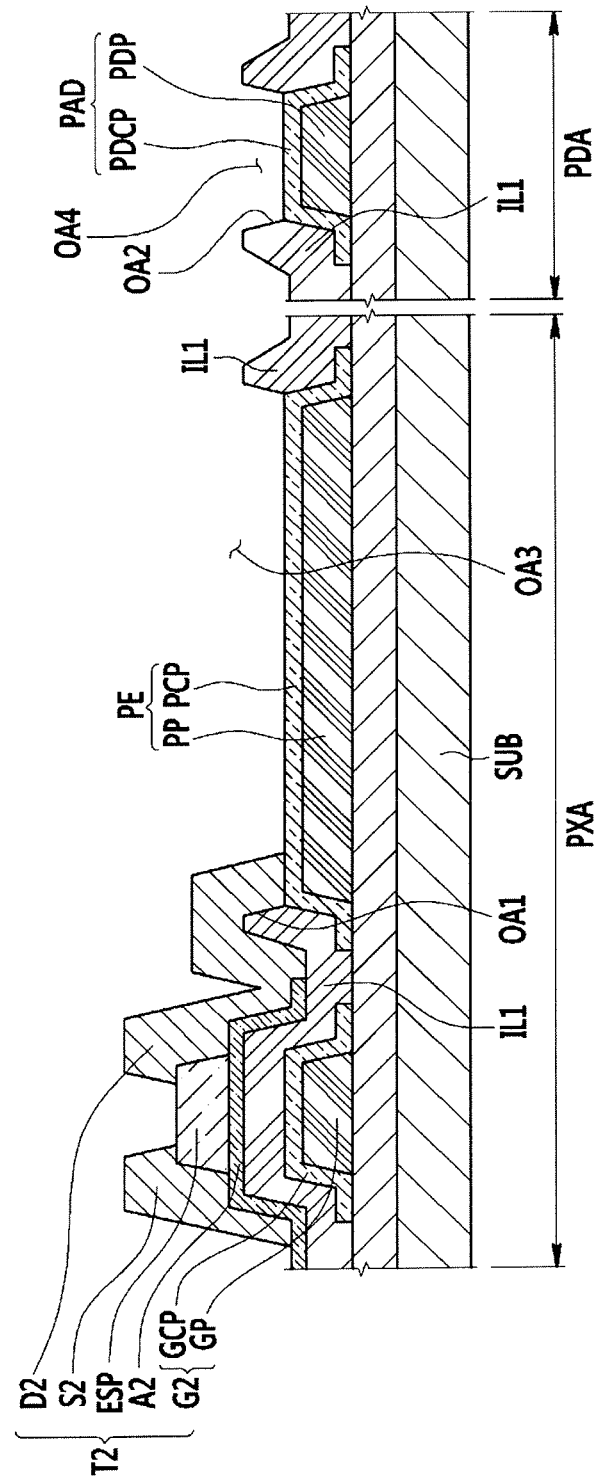

Next, as shown in FIG. 6, the source electrode and the drain electrode may be formed (S600).

After the metal layer is formed on the second oxide semiconductor layer A2, the second source electrode S2 and the second drain electrode D2 which may each be in contact with end portions of the second oxide semiconductor layer A2 may each be formed by patterning the metal layer using the photolithography process. The first source electrode and the first drain electrode may be formed together with the second source electrode S2 and the second drain electrode D2.

By the processes as described above, the driving thin film transistor T2 may be formed, and the switch thin film transistor may be formed together with the driving thin film transistor T2.

Figure 7:
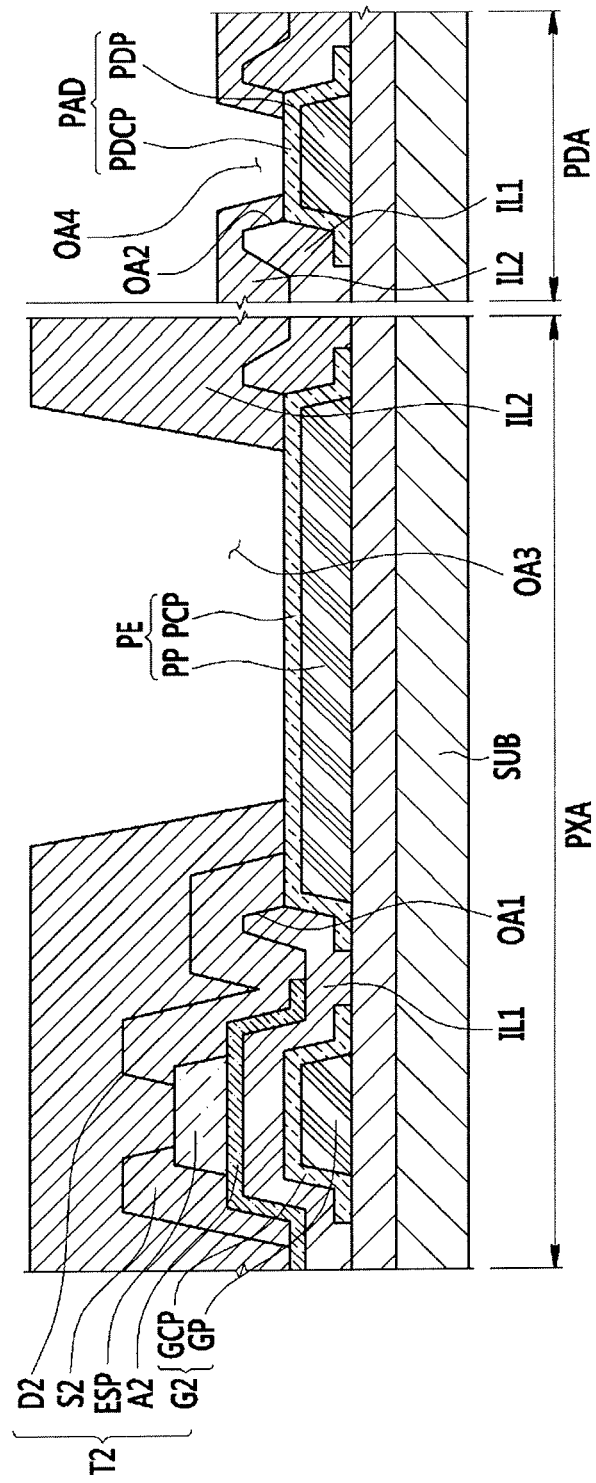

Next, as shown in FIG. 7, the second insulating layer IL2 including the third opening OA3 and the fourth opening OA4 may be formed (S700).

The second insulating layer IL2 including the third opening OA3 which may be in communication with the first opening OA1 and the fourth opening OA4 which may be in communication with the second opening OA2 may be formed by forming the second insulating layer IL2 including a photoresist material on the driving thin film transistor T2 and exposing and developing the second insulating layer IL2 using the halftone mask. A portion of the second insulating layer IL2 corresponding to the pad clad pattern PDCP positioned in the pad area PDA may be formed to have a lower height than the other portion positioned in the pixel area PXA.

Figure 8:
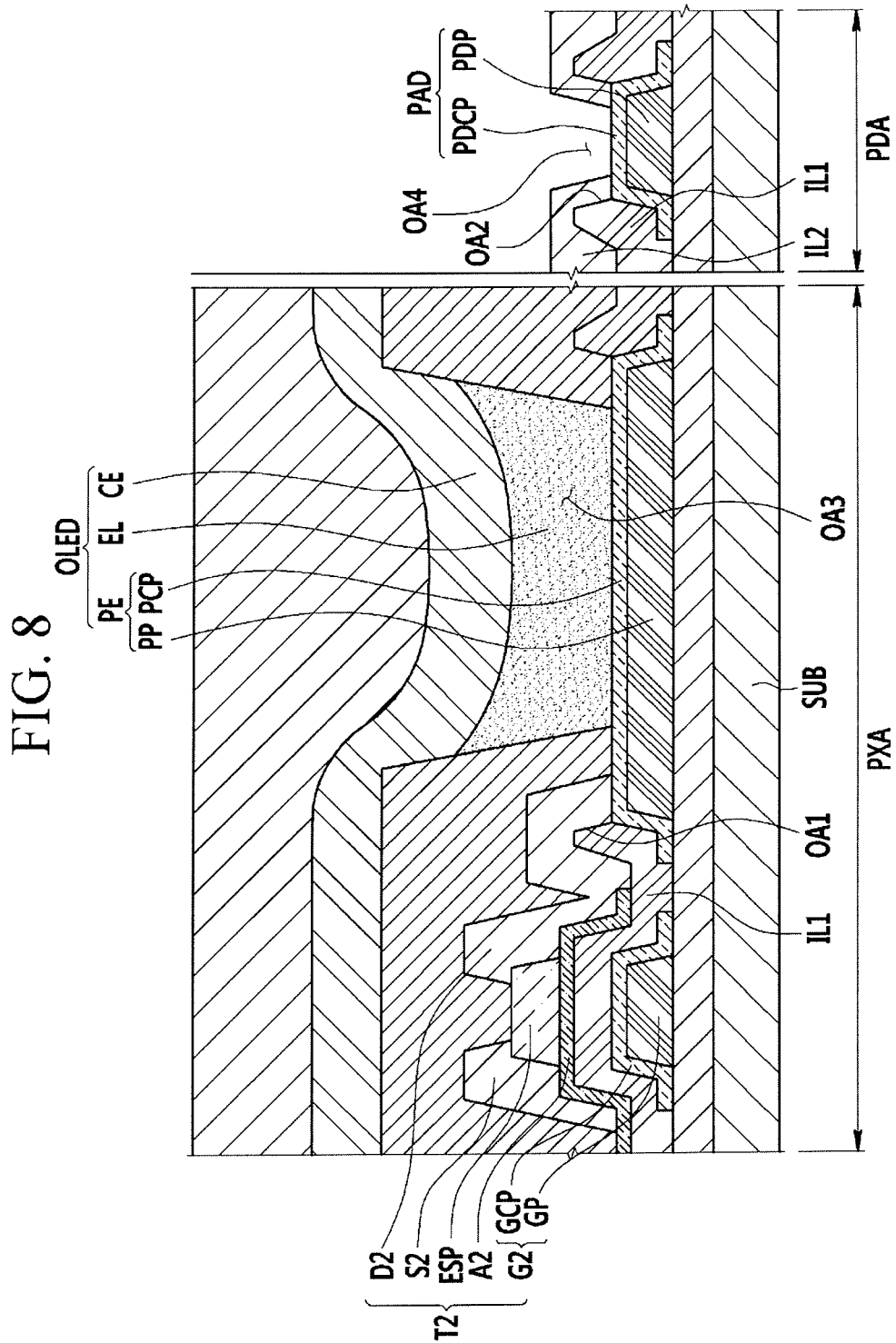

Next, as shown in FIG. 8, the organic light emitting layer EL may be formed (S800).

The organic light emitting layer EL may be formed on the pixel clad pattern PCP to correspond to the third opening OA3. The organic light emitting layer EL may be formed on the pixel clad pattern PCP by using a deposition process using the mask.

Next, the common electrode CE may be formed (S900).

The common electrode CE may be formed on the organic light emitting layer EL.

By the processes as described above, the organic light emitting diode (OLED) including the pixel electrode PE, the organic light emitting layer EL, and the common electrode CE may be formed.

Next, the encapsulation covering the common electrode may be formed.

In the method for manufacturing the organic light emitting diode display according to an exemplary embodiment of the present invention, since each of the second gate electrode G2, the pixel electrode PE, and the pad portion PAD may include the gate clad pattern GCP, the pixel clad pattern PCP, and the pad clad pattern PDCP, respectively, delay of the signal passing through the second gate electrode G2 by the parasitic capacitance may be reduced or eliminated. The light emitted from the organic light emitting layer EL may be reflected by the pixel electrode PE, thus increasing light emitting efficiency of the organic light emitting diode (OLED). Oxidation of the surface of the pad portion PAD with the non-conductive metal oxide layer may be reduced or eliminated.

In the method for manufacturing the organic light emitting diode display according to another exemplary embodiment of the present invention, even though the gate clad pattern GCP, the pixel clad pattern PCP, and the pad clad pattern PDCP are formed, since the gate clad pattern GCP, the pixel clad pattern PCP, and the pad clad pattern PDCP are formed by using the same mask as that forming the gate pattern GP, the pixel pattern PP, and the pad pattern PDP, manufacturing costs may be reduced.

In the method for manufacturing the organic light emitting diode display according to another exemplary embodiment of the present invention, when two halftone masks are used, and the organic light emitting diode display is manufactured by using only a total of six masks, a manufacturing time and manufacturing costs for manufacturing the organic light emitting diode display may be reduced.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A thin film transistor comprising:
a gate electrode comprising a gate pattern positioned on a substrate and a gate clad pattern covering the gate pattern, wherein the gate clad pattern is wider than the gate pattern, and wherein the gate clad pattern comprises at least one extension portion in direct contact with the substrate and extending along an upper surface of the substrate;
an oxide semiconductor layer positioned on the gate electrode; and
a source electrode and a drain electrode positioned on the oxide semiconductor layer, wherein the source electrode and the drain electrode are each in contact with end portions of the oxide semiconductor layer.

2. The thin film transistor of claim 1, wherein the gate pattern comprises a metal, and wherein the gate clad pattern comprises a metal oxide.

3. The thin film transistor of claim 2, wherein the metal oxide comprises indium tin oxide (ITO).

4. An organic light emitting diode display comprising:
a substrate;
a thin film transistor comprising a gate electrode, wherein the gate electrode comprises a gate pattern positioned on the substrate and a gate clad pattern covering the gate pattern;
an oxide semiconductor layer positioned on the gate electrode;
a source electrode and a drain positioned on the oxide semiconductor layer, wherein the source electrode and the drain electrode are each in contact with end portions of the oxide semiconductor layer;
an organic light emitting diode connected to the thin film transistor, wherein the organic light emitting diode comprises a pixel electrode comprising a pixel pattern positioned on the same layer as the gate pattern and a pixel clad pattern positioned on the same layer as the gate clad pattern, wherein the pixel clad pattern covers the pixel pattern, and wherein the pixel clad pattern is connected to the drain electrode, an organic light emitting layer positioned on the pixel electrode, and a common electrode positioned on the organic light emitting layer,
wherein the substrate comprises a pad area spaced apart from an area in which the organic light emitting diode is positioned, and wherein the organic light emitting diode display further comprises a pad portion positioned on the substrate in the pad area, wherein the pad portion comprises a pad pattern positioned on the same layer as the gate pattern and a pad clad pattern positioned on the same layer as the gate clad pattern, and wherein the pad clad pattern covers the pad pattern; and
a first insulating layer positioned between the gate electrode and the oxide semiconductor layer, wherein the first insulating layer comprise a first opening exposing at least a portion of the pixel electrode, and a second opening exposing at least a portion of the pad portion.

5. The organic light emitting diode display of claim 4, wherein one or more of the gate pattern, the pixel pattern, and the pad pattern comprise a metal, and wherein one or more of the gate clad pattern, the pixel clad pattern, and the pad clad pattern comprise a metal oxide.

6. The organic light emitting diode display of claim 5, wherein the metal oxide includes indium tin oxide (ITO).

7. The organic light emitting diode display of claim 4, wherein the thin film transistor further comprises an etch stopping pattern positioned between each of the source electrode, the drain electrode, and the oxide semiconductor layer, and wherein each of the first opening and the second opening is formed substantially simultaneously with the etch stopping pattern.

8. The organic light emitting diode display of claim 4, further comprising:
a second insulating layer covering the thin film transistor, wherein the second insulating layer comprises a third opening exposing at least a portion of the pixel electrode, by being in communication with the first opening, and a fourth opening exposing at least a portion of the pad portion by being in communication with the second opening.

9. The organic light emitting diode display of claim 8, wherein a portion of the second insulating layer in the pad area has a lower height than a portion of the second insulating layer in the pixel area.

10. A method for manufacturing an organic light emitting diode display, the method comprising:
forming a gate pattern, a pixel pattern, and a pad pattern which are spaced apart from each other, on a substrate;
forming each of a gate clad pattern, a pixel clad pattern, and a pad clad pattern covering the gate pattern, the pixel pattern, and the pad pattern, respectively;
forming a first insulating layer covering each of the gate clad pattern, the pixel clad pattern, and the pad clad pattern;
forming an oxide semiconductor layer over the gate clad pattern, wherein the first insulating layer is disposed between the oxide semiconductor layer and the gate clad pattern;
forming each of a first opening exposing at least a portion of the pixel clad pattern, and a second opening exposing at least a portion of the pad clad pattern in the first insulating layer, while forming an etch stopping pattern on the oxide semiconductor layer;
forming a source electrode and a drain electrode that are each in contact with end portions of the oxide semiconductor layer;

forming a second insulating layer covering each of the source electrode and the drain electrode, wherein the second insulating layer includes a third opening exposing at least a portion of the pixel clad pattern, by being in communication with the first opening, and a fourth opening exposing at least a portion of the pad clad pattern, by being in communication with the second opening;

forming an organic light emitting layer on the pixel clad pattern; and forming a common electrode on the organic light emitting layer.

11. The method of claim 10, wherein the forming of each of the etch stopping pattern, the first opening, and the second opening is performed by using a halftone mask.

12. The method of claim 10, wherein a portion of the second insulating layer corresponding to the pad clad pattern has a lower height than the other portion, and wherein the forming of the second insulating layer is performed by using a halftone mask.

13. The method of claim 10, wherein the forming of each of the gate clad pattern, the pixel clad pattern, and the pad clad pattern is performed by using the same mask as that used when forming the gate pattern, the pixel pattern, and the pad pattern.

14. A thin film transistor comprising:
a substrate;
a gate pattern disposed on the substrate;
a gate clad pattern disposed on the gate pattern and a portion of the substrate, wherein the gate clad pattern covers the gate pattern, wherein the gate clad pattern is wider than the gate pattern, and wherein the gate clad pattern comprises at least one extension portion in direct contact with the substrate and extending along an upper surface of the substrate;
a first insulating layer disposed on the gate clad pattern;
an oxide semiconductor layer disposed on the first insulating layer;
source and drain electrodes disposed on the oxide semiconductor layer; and
an etch stopping pattern disposed between the source and drain electrodes.

15. The thin film transistor of claim 14, wherein the gate pattern comprises a metal, and wherein the gate clad pattern comprises a metal oxide.

16. The thin film transistor of claim 15, wherein the metal oxide comprises indium tin oxide (ITO).

17. The thin film transistor of claim 14, wherein the gate clad pattern and the gate pattern form a gate electrode, and wherein at least a portion of the source and drain electrodes overlap the gate electrode.

* * * * *